United States Patent

Ormsby

[11] 4,021,664
[45] May 3, 1977

[54] STORAGE AND RETRIEVAL OF GRAPHIC INFORMATION

[76] Inventor: Thomas R. Ormsby, 1669 Lake Ave., Rochester, N.Y. 14615

[22] Filed: Feb. 3, 1975

[21] Appl. No.: 546,660

Related U.S. Application Data

[62] Division of Ser. No. 429,224, Dec. 28, 1973, Pat. No. 3,882,468.

[52] U.S. Cl. .................. 250/227; 235/61.12 N; 340/380; 350/96 R; 353/25
[51] Int. Cl.² ........................................ G11B 23/40
[58] Field of Search ............... 350/96 R, 96 B; 340/380; 250/227; 235/61.12 N; 353/25, 26 A, 26 R

[56] References Cited
UNITED STATES PATENTS
3,728,521   4/1973   Borough et al. ............ 235/61.12 N Primary Examiner—Eugene La Roche

[57] ABSTRACT

Image-bearing elements made of support material that transmits light longitudinally through its cross-section, in a plane parallel to its image-bearing surface, are disclosed for use in an information retrieval system. The retrieval code used in identifying each element is generated by modulating a directed beam of light transmitted longitudinally through the element's cross-section. Modulation of the directed beam is accomplished by, for example, placing opaque spots on a cross-sectional area of the element, punching holes in the element, or by placing a code mask at the end of the element from which the directed beam emanates. The code modulated beam is photoelectrically detected and the resulting electrical retrieval codes are used in the retrieval process.

2 Claims, 7 Drawing Figures

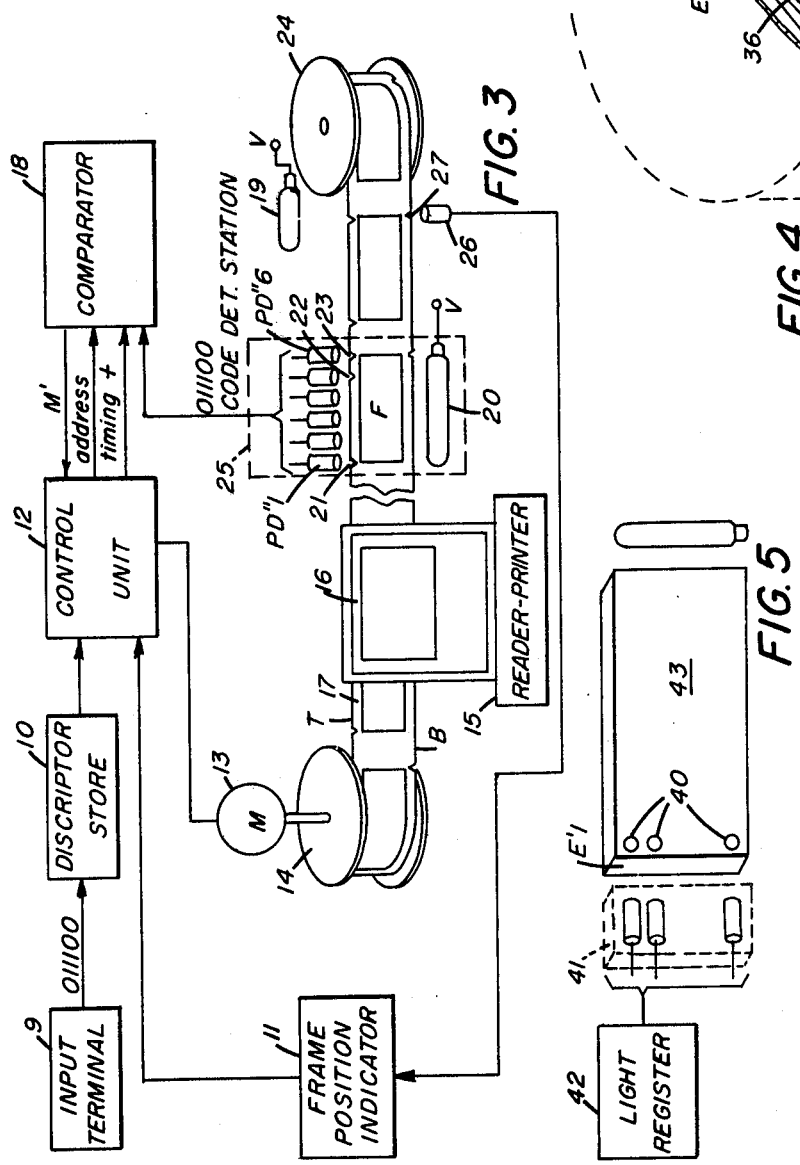
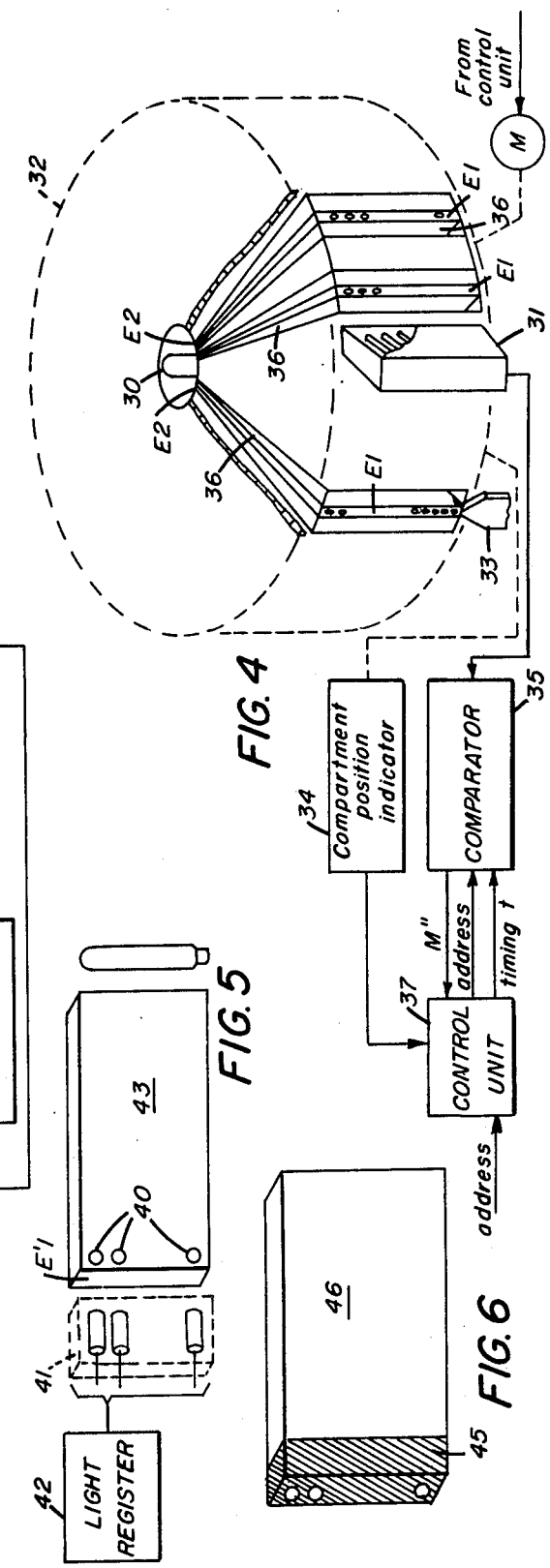

STORAGE AND RETRIEVAL OF GRAPHIC INFORMATION

This is a divisional of application Ser. No 429,224, filed on Dec. 28, 1973, now U.S. Pat. No. 3,882,468.

BACKGROUND OF THE INVENTION

1. Field of the Invention

This invention relates to information retrieval and, more particularly, to an improvement in the manner in which graphic materials are identified in information retrieval systems.

2. Description of the Prior Art

The prior art includes numerous types of apparatus for searching and retrieving graphic material. A survey of several representative types of commercially available automated film retrieval systems appears in Automated Film Systems, Business Automation, September, 1970. The systems described in this survey are designed to retrieve graphic material photographically recorded on either microfiche or strip microfilm supports. In an automated film retrieval system, the film used includes recorded retrieval code patterns that identify segments of the film containing various sections of stored graphic material. Such a system also includes an input terminal from which a user supplies descriptor information that identifies the film segment containing the graphic material to be retrieved and control apparatus that responds to the user-supplied descriptor information and to signals representing the retrieval codes on the film by locating the desired graphic material on the film in a position for viewing or printing.

The prior art discloses numerous techniques for placing retrieval codes on graphic material supports, such as photographic film, which include the use of indicia that can be optically, magnetically, and mechanically detected. Examples of prior art coding techniques and retrieval apparatus are shown in the following U.S. patents: J. F. Cameron et al., U.S. Pat. No. 3,484,751, issued Dec. 16, 1969; P. R. Adams et al., U.S. Pat. No. 3,144,637, issued Aug. 11, 1964; and J. W. Bryce, U.S. Pat. No. 2,124,906, issued July 26, 1938. These prior art coding techniques have two concepts in common: the positions at which retrieval codes are located on a graphic material support, and the placement of code detection apparatus relative to the support for detecting such codes. More specifically, the prior art shows the recording of retrieval codes on a storage surface or a face of the graphic material support with which they are used and these codes are detected by apparatus with sensors that are located adjacent to the support face. While this approach to recording retrieval codes on graphic material supports is useful in many applications, it requires that retrieval codes be stored in portions of the information storage surface of a support, and this reduces the amount of graphic material that can be stored in a particular section of the support. Additionally, there are instances where the operating speed of retrieval apparatus is reduced when it is necessary to locate code detector sensors adjacent to a face of a graphic material support. Also, there are situations where, due to equipment design, it is inconvenient to locate code detector sensors in such a position.

SUMMARY OF THE INVENTION

The invention overcomes the problems inherent in prior art coding techniques by transmitting a directed light beam through the cross-section of a segment of graphic material support, in a plane parallel to the support storage surface, and modulating the directed beam to produce an optical code identifying the support segment. More specifically, the cross-sectional area of one edge of the support is illuminated to produce a directed beam that travels longitudinally through the cross-section of the support and emanates from the cross-sectional area of a second edge of the support. The directed beam can be modulated by code patterns recorded in or on the support or by devices, such as, for example, code masks, placed in the path of the directed light beam after it emanates from the cross-sectional area of the second edge of the support. In essence, the invention recognizes that certain types of support material may be used as a light pipe and that light emanating from a cross-sectional area of such support materials can be modulated to produce detectable optical codes. For example, where it is desirable to increase the information recording capacity of photographic film, retrieval code patterns can be recorded on an edge cross-section of the film, rather than on its recording surface, in the form of ink spots which code modulate a light beam transmitted longitudinally through the film cross-section toward the edge cross-section. Optical codes produced in this manner are detected by sensors placed adjacent to the coded edge cross-section of the film from which the modulated light beam emanates.

In summary, the invention, by taking advantage of previously unused light piping characteristics of certain graphic material supports, provides several advantages over the prior art. One primary advantage of the invention is that it allows more efficient use of the recording or storage surface of such supports by eliminating the need to record retrieval codes on such surfaces. Another important advantage of the invention is that it allows sensors for detecting retrieval codes identifying such supports to be positioned adjacent to a cross-sectional area of as opposed to being positioned adjacent to a face of the support. In certain applications, positioning these sensors adjacent to a cross-sectional area of a support increases the speed at which an information retrieval system can operate and reduces the cost of such systems by eliminating the need for complex code detection apparatus. In addition to the foregoing, numerous other features and advantages of the invention will become apparent to one skilled in the art upon reading the following detailed disclosure.

OBJECTS OF THE INVENTION

It is an object of the invention to modulate a light beam emanating from a cross-sectional area of a graphic material support.

It is another object of the invention to utilize the light pipe characteristics of a support in identifying designated portions of graphic materials stored on the support.

It is yet another object of the invention to allow retrieval codes to be placed on a graphic material support without utilizing any of the support storage surface.

It is a more specific object of the invention to identify graphic material stored on a support by means of a modulated light beam emanating from a cross-sectional area of the support.

It is a still more specific object of the invention to allow images recorded on a microfilm support to be identified by optically detecting a modulated light beam emanating from a cross-sectional area of the microfilm support.

BRIEF DESCRIPTION OF THE FIGURES

FIG. 3 shows another example of a graphic material support coded in accordance with the invention, and a block diagram of a system for automatically retrieving graphic material stored on such a support;

FIG. 4 shows a drawing of apparatus useful in retrieving microfiche that is coded in accordance with the invention; and FIGS. 5, 6, and 7 show additional examples of techniques by which codes identifying graphic material supports may be obtained in accordance with the invention.

DESCRIPTION OF THE ILLUSTRATIVE EMBODIMENT

Figure 1:
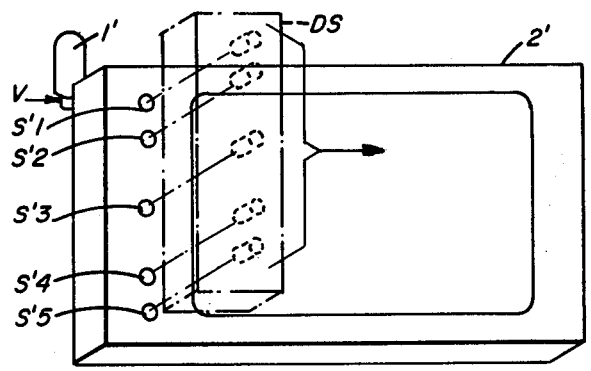
FIG. 1 shows a representative example of a graphic material support coded in accordance with the prior art, and the arrangement of apparatus used in identifying a support coded in this manner.

A representative example of a graphic material support 2', such as microfiche, coded in accordance with the prior art, is shown in FIG. 1. It will be noted that the support 2' is coded by recording a pattern of spots S'1 through S'5 on the recording surface of the support. where the section of the support 2' in which the spots are recorded is transparent, the spots are opaque. A code modulated beam is produced by the spots when the rear side of the support 2' is illuminated with a light emitted from a source 1' and this modulated beam, which emanates from the front side of the support, is detected with a set of photodetectors DS. In essence, the prior art utilizes light applied transversely to the plane in which the storage or recording surface of a support material lies, and photodetectors located adjacent to this surface of the support to detect codes recorded on the surface.

Figure 2:
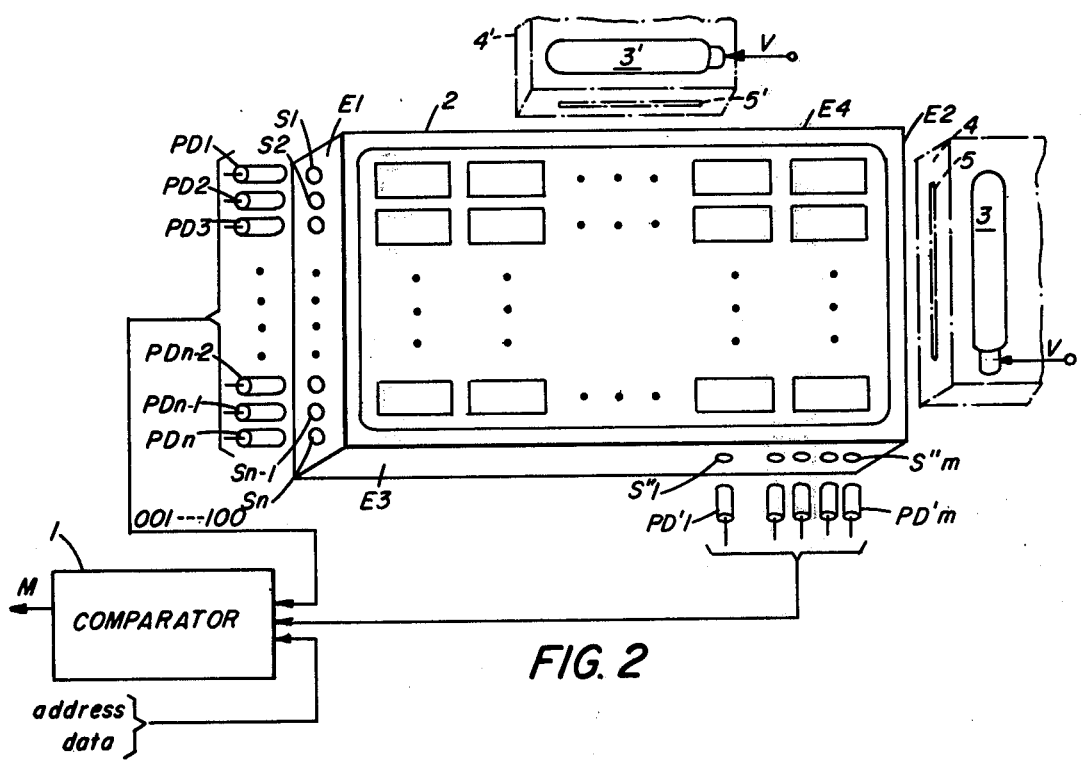
FIG. 2 shows an example of one type of graphic material support coded in accordance with the invention and a partial block diagram of apparatus for identifying a support coded in this manner.

Referring to FIG. 2, a graphic material support 2, coded in accordance with the invention, is shown positioned with one of its edge cross-sections E2 adjacent to an aperture 5 in an enclosure 4 containing a light 3, and another cross-section E1 adjacent to a set of photodetectors PD1 through $PD_n$. This support 2 may be made of any one of a number of well-known materials that transmit light applied at one edge E2 or E4 longitudinally through their cross-sections to another edge E1 or E3. For purposes of discussion, it will be assumed that the support 2 is a piece of Estar, i.e., polyethylene terephthalate, microfiche, manufactured by Eastman Kodak Company, which has the required light transmitting qualities. Consequently, illumination of the edge E2 of the support 2 via the aperture 5 results in the transmission of a beam of light through the cross-section of the support toward the edge E1. The edge cross-section E1 of the support 2 contains a pattern of opaque spots $S_1$, $S_2$, $S_{n-1}$, and $S_n$, which modulate the light beam as it emanates from the support edge E1. The photodetectors PD1 through $PD_n$ respond to the modulated light beam by generating a set of code signals that are applied to a comparator 1. More specifically, the spots $S_1$, $S_2$, $S_{n-1}$, and $S_n$ block the portions of the transmitted light beam that would normally illuminate the photodetectors PD1, PD2, $PD_{n-1}$, and $PD_n$, and this results in a 0 output from these photodetectors. If there are no other spots present on the edge E1 of the support 2, the set of photodetectors PD1 through $PD_n$ will generate a set of code signals 001 ... 100 that identifies the coded support. The comparator 1 compares these code signals with user-supplied descriptor or address signals identifying a desired support element to determine if the two sets of signals are identical. If the support 2 is the desired support, the two sets of signals will match, and the comparator 1 will generate a signal M indicating the occurrence of the match. Conversely, if the two sets of signals do not match, apparatus described later replaces the coded support 2 with another coded support, and the comparison operation described above is repeated. The use of a signal such as the signal M generated by the comparator 1 in controlling retrieval apparatus will be described later in connection with the description of FIG. 3.

As indicated in FIG. 2, a set of photosensors PD'1 through $PD'_m$ may also be placed adjacent to the bottom edge cross-section E3 of the support 2 to detect additional code segments recorded by placing a pattern of opaque spots $S''_1$, $S''_2$, $S''_3$, and $S''_m$ on that edge. Illumination provided by a light 3' via an aperture 5' in an enclosure 4' is transmitted longitudinally through the cross-section of the support 2 and emerges as a code modulated beam to which the photodetectors PD'1 through $PD'_m$ respond. The outputs of these photodetectors can also be applied to the comparator 1 as part of the code used to identify the support. It may be desirable to record code patterns on more than one edge of of a support where a large number of supports are to be identified by codes in a given code format. Similarly, this approach to recording codes is also useful where a code format requiring a large number of bit positions, such as an alphabetic code, is used to identify supports.

A block diagram of a microfilm retrieval system that implements the invention is shown in FIG. 3. This system is utilized in retrieving graphic material stored in various frames of a strip microfilm support 17. To operate this system, a user supplies descriptor signals in the form of frame address information to a control unit 12 via an input terminal 9 and a descriptor store 10. The control unit 12 responds to the frame address information by generating a signal that activates a motor 13. The motor 13 rotates a takeup reel 14, and this results in the microfilm support 17 moving past a code detection station 25 as it is unwound from the reel 24.

It will be noted that the microfilm (FIG.3) contains notches 21, 22, and 23 on its edge T adjacent to a set of photodetectors PD''1 through PD''6 in the code detection station 25 and that a light 20 is positioned to illuminate the cross-sectional area of the edge B of the microfilm. For purposes of discussion, it will be assumed that a six bit binary code is used to identify each frame of the microfilm and that the zeroes in this code are represented by the notches in the edge T of the microfilm. The notches serve the same purpose as the opaque spots on the edge cross-section of the support shown in FIG. 2. They interrupt the transmission of portions of the light beam transmitted longitudinally through the cross-section of the microfilm 17, parallel to the film recording surface, and produce a code modulated beam at the top edge T of the microfilm that is detected by the photodetectors PD''1 through PD''6. In this case, when the microfilm frame F is aligned with the photodetectors PD"1 through PD"6, the modulated light beam produced by the notches 21, 22, and 23 will result in the photodetectors generating a code 011100.

Frame position signals are generated as a result of notches at the edge B of the microfilm strip 17, such as the notch 27, interrupting the light transmitted from a light 19, through the microfilm strip, to a photodetector 26 each time a frame is properly aligned with the photodetectors PD"1 through PD"6. Consequently, when the frame F is properly aligned with the photodetectors PD"1 through PD"6. the photodetector 26 responds to the resulting interruption of light transmission by generating a signal that is applied to a frame position indicator 11 which, in turn, generates a frame position pulse that is applied to the control unit 12. The control unit responds to the frame position pulse by generating a timing signal $t$ that is applied to a comparator 18 while the microfilm frame F is properly aligned with the photodetectors PD"1 through PD"6 for detecting the code notched in the edge T of the microfilm 17. Additionally, the control unit 12 applies the frame address information supplied by the user as an input to the comparator 18. When the timing signal $t$ is applied to the comparator 18, the outputs of the photodetectors PD"1 through PD"6, representing the code associated with the microfilm frame aligned with the photodetectors, are compared with the user-supplied frame address information by the comparator 18. If the frame address information and the photodetector outputs match, the comparator 18 generates a signal M' that is applied to the control unit 12. More specifically, if the user-supplied frame address information is 011100, the comparison of this address with the 011100 output of the photodetectors PD"1 through PD"6 when the microfilm frame F is aligned with the photodetectors results in the comparator 18 generating the signal M' indicating the occurrence of a match. The control unit 12 responds to the signal M' and the output pulses of the frame position indicator 11 by positioning the frame F in the reader-printer station 15. More specifically, when the signal M' is applied to the control unit 12, the unit counts the output frame position pulses of the frame position indicator 11 to determine when the frame F is positioned in the reader-printer 15 and, at this point, generates a signal that terminates the operation of the motor 13. While the frame F is positioned in the reader-printer 15, it is illuminated by a light and imaged on a screen 16 for viewing. Additionally, the frame F can, at this time, also be reproduced by the printer. The reader-printer station 15 may be any one of a number of commercially available reader-printers.

A perspective view of microfiche retrieval apparatus that implements the invention is shown in FIG. 4. In this apparatus, sheets of coded microfiche 36 are stored in compartments of a rotating drum file. Basically, this type of unit operates in a manner that is similar to the operation of the previously described system shown in FIG. 3, except that in this case a motor-driven drum file 32, containing sheets of microfiche, is used instead of a takeup reel 14 (FIG. 3). It is obvious that the invention is particularly useful in a unit of this type, since it would be inconvenient to use prior art code detection apparatus with recorded material stored in this manner. The sheet of microfiche contained in each compartment of the drum file 32 may be similar to the support 2 shown in FIG. 2. The coded sheets of microfiche are placed in the drum file storage slots with their coded ends E1 facing outward, and the other ends E2 of the microfiche sheets facing a light source 30. As the drum file 32 rotates, the coded end of a microfiche sheet comes into alignment with photodetectors in a code detection unit 31 and the code modulated light beam emanating outwardly from the coded end E1 of the microfiche sheet is detected by the code detection unit 31. At this point, a compartment position indicator 34 generates a signal that is applied to a control unit 37 which responds by applying a timing signal T to a comparator 35. The compartment position indicator may be a switch mechanically connected to the drum file 32 in such a way that it generates a pulse as each compartment comes into alignment with the code detection unit 31. The generation of the timing signal T results in the detected code being compared with user-supplied address data by the comparator 35 in the same manner as previously described in discussing the system shown in FIG. 3. Obviously, in designs of the apparatus where little noise is generated during apparatus operation, the synchronization provided by the signal T may not be required, since the synchronization of comparisons of detected codes and user supplied frame address information can be controlled by the illumination that results as each compartment of the drum file comes into alignment with the code detection unit 31.

When there is a match between the code on a sheet of microfiche and the user-supplied address data, the drum file 32 will continue to rotate until this sheet of microfiche is aligned with an output pointer 33 and then stop. In this case, positioning the compartment containing the desired sheet of microfiche at the pointer 33 is accomplished by counting the output pulses of the compartment position indicator 34 that occur after the generation of a comparator output signal M" indicating a match between the microfiche code and the user-supplied address data. After the desired sheet of microfiche is positioned at the output pointer 33, it can be extracted and placed in a reader-printer to allow viewing and printing of the recorded information that it contains.

Another method of recording code patterns in a support material in accordance with the invention is shown in FIG. 5. In those instances where there is no need to save recording space, but the design of the retrieval system is such that the use of the invention is desirable, such as in a rotating drum file system, the code pattern may be punched as a series of holes 40 near the edge E'1 of the support 43 from which the code modulated beam is to emanate. The use of such holes will produce substantially the same modulation of a light beam transmitted longitudinally through the cross-section of a sheet of graphic material support, such as photographic film, as that produced by the previously described opaque spots and notches. In essence, each hole interrupts the transmission of light in the section of the film sheet in which it is located and results in little or no light emanating from the area of the film edge cross-section located adjacent to a hole. In the arrangement shown in FIG. 5, the output signals of a code detection station 41 produced by a code modulated beam are applied to a light register 42. Each output of code detection station 41 controls the state of a light in the light register 42 and, hence, a light pattern is produced in the light register that is a visual display of the detected code. This arrangement is useful during file updating operations where, for example, microfiche elements in a rotating drum file are being manually identified by code number to locate the compartments in the drum file where such elements are to be added, removed, or replaced.

In summary, the foregoing has described apparatus for use with a graphic material support containing recorded code patterns that modulate a light beam transmitted longitudinally through the support cross-section in a plane parallel to the support storage or recording surface. Apparatus for dectecting or displaying the resulting optical code is located adjacent to the cross-sectional area of the support from which the modulated beam emanates and responds to the modulated beam by producing signals that are useful in identifying the support and the graphic material that it contains.

While the invention has been described in terms of illustrative microfilm retrieval equipment, its usefulness is not limited to such equipment. It is clear that the invention is useful in any application that requires the identification of elements that have the indicated light transmitting characteristics. Similarly, it is clear that the described use of opaque ink spots, notches, and circular holes to record a code pattern in or on a support is merely illustrative of numerous well-known methods of obtaining a modulated light beam. For example, it is possible to modulate a light beam passing longitudinally through the cross-section of a support material by positioning pieces of opaque material in selected locations at one end of the support material. Additionally, a modulated light beam can be obtained by positioning an opaque mask with a code pattern punched in it at the end of the material. In either of these cases, the opaque material may or may not be attached to the support material. For instance, a modulated light beam can be obtained by physically attaching a mask 45 (FIG. 6) containing a code pattern to the end of a support 46. Alternatively, a modulated light beam can be obtained by using the end 47 (FIG. 7) of a rotating drum file storage compartment 49 to mask portions of the light beam transmitted longitudinally through the cross-section of a support 48.

The invention has been described in detail with particular reference to illustrative embodiments thereof, but it will be understood that variations and modifications can be effected within the spirit and scope of the invention.

What is claimed is:

1. In combination:
    a photographic support comprised of polyethylene terepthalate and capable of transmitting a beam of light through its cross-section in a plane parallel to its storage surface;
    illuminating means located adjacent to a first edge of said support for producing a beam of light directed through said support toward a second edge of said support;
    a code pattern recorded in the form of perforations which are selectively located along said second edge of said support for obstructing passage of such light and thereby optically modulating the directed light beam; and
    light-responsive signal generating means located adjacent to said seond edge for converting the optically modulated beam emanating from said second edge into electrical signals.

2. The combination of claim 1 wherein (1) said second edge is opposite said first edge (2) said code pattern is recorded as a set of triangular notches, which notches are selectively located at positions along said second edge to obstruct emanation of beamed light at such positions, and (3) said light responsive signal generating means comprises a plurality of photodetectors, arranged to align with said positions on said support, for converting said optically modulated beam into electrical code signals representing said code pattern.

* * * * *

UNITED STATES PATENT AND TRADEMARK OFFICE
CERTIFICATE OF CORRECTION

PATENT NO. : U. S. 4,021,664
DATED : May 3, 1977
INVENTOR(S) : Thomas R. Ormsby

It is certified that error appears in the above-identified patent and that said Letters Patent are hereby corrected as shown below:

On the cover sheet the assignee should read:

-- Eastman Kodak Company, Rochester, N. Y. --.

Col. 2, line 40, after "area of" insert --a support--

Col. 4, line 51, after "microfilm" insert --17--.

Signed and Sealed this

Thirteenth Day of December 1977

[SEAL]

Attest:

RUTH C. MASON
Attesting Officer

LUTRELLE F. PARKER
Acting Commissioner of Patents and Trademarks